(12) United States Patent
Fuller et al.

(10) Patent No.: US 11,869,787 B2
(45) Date of Patent: Jan. 9, 2024

(54) SUBSTRATE CONTAINER VALVE ASSEMBLIES

(71) Applicant: ENTEGRIS, INC., Billerica, MA (US)

(72) Inventors: Matthew A Fuller, Colorado Springs, CO (US); Mark V. Smith, Colorado Springs, CO (US); Jeffery J. King, Colorado Springs, CO (US); John Burns, Colorado Springs, CO (US)

(73) Assignee: ENTEGRIS, INC., Billerica, MA (US)

( * ) Notice: Subject to any disclaimer, the term of this patent is extended or adjusted under 35 U.S.C. 154(b) by 896 days.

(21) Appl. No.: 16/886,371

(22) Filed: May 28, 2020

(65) Prior Publication Data

US 2020/0365435 A1 Nov. 19, 2020

Related U.S. Application Data

(62) Division of application No. 15/532,320, filed as application No. PCT/US2015/063260 on Dec. 1, 2015, now abandoned.

(Continued)

(51) Int. Cl.
*B65D 85/30* (2006.01)
*H01L 21/673* (2006.01)
(Continued)

(52) U.S. Cl.
CPC ...... *H01L 21/67393* (2013.01); *F16K 15/148* (2013.01); *F16K 27/0209* (2013.01); *H01L 21/6732* (2013.01); *H01L 21/67379* (2013.01)

(58) Field of Classification Search
CPC .......... H01L 21/67393; H01L 21/6732; H01L 21/67379; F16K 15/148; F16K 27/0209
(Continued)

(56) References Cited

U.S. PATENT DOCUMENTS

| 4,815,912 A | 3/1989 | Maney |
| 4,995,430 A | 2/1991 | Bonora |

(Continued)

FOREIGN PATENT DOCUMENTS

| CN | 201990010 U | 9/2011 |
| CN | 102859112 A | 1/2013 |

(Continued)

*Primary Examiner* — Luan K Bui

(57) ABSTRACT

A substrate container includes a container portion having an open side or bottom, and a door to sealingly close the open side or bottom, one of the door and the container portion defining access structure. The substrate container additionally includes a check-valve assembly, the check-valve assembly being retained with respect to the access structure to provide fluid communication with an interior of the substrate container. The check-valve assembly includes a grommet, the grommet being formed of an elastomeric material. A valve seat is disposed within the grommet, the valve seat being integrally formed with the grommet according to one aspect, and being formed of a separate piece according to another aspect. An elastomeric valve member, specifically an elastomeric umbrella valve member according to one aspect, is disposed within the grommet and held to engage the valve seat, thereby restricting fluid flow through the check-valve assembly with respect to the interior of the substrate container.

5 Claims, 9 Drawing Sheets

Related U.S. Application Data

(60) Provisional application No. 62/086,022, filed on Dec. 1, 2014.

(51) Int. Cl.
*F16K 15/14* (2006.01)
*F16K 27/02* (2006.01)

(58) Field of Classification Search
USPC .................................. 206/454, 710–711, 832
See application file for complete search history.

(56) References Cited

U.S. PATENT DOCUMENTS

| | | | |
|---|---|---|---|
| 5,067,449 A | 11/1991 | Bonde | |
| 5,499,614 A | 3/1996 | Busato et al. | |
| 5,788,082 A | 8/1998 | Nyseth | |
| 5,988,233 A | 11/1999 | Fosnight | |
| 6,010,008 A | 1/2000 | Nyseth | |
| 6,042,651 A | 3/2000 | Roberson, Jr. | |
| 6,164,664 A | 12/2000 | Fosnight | |
| 6,187,182 B1 | 2/2001 | Reynolds | |
| 6,354,601 B1 | 3/2002 | Krampotich | |
| 6,428,729 B1 | 8/2002 | Bhatt | |
| 7,201,276 B2 | 4/2007 | Burns | |
| 7,455,180 B2 * | 11/2008 | Sumi | H01L 21/67379 206/711 |
| 8,727,125 B2 * | 5/2014 | Tieben | H01L 21/67017 211/41.18 |
| 8,783,463 B2 | 7/2014 | Watson | |
| 10,041,386 B2 | 8/2018 | Coolens | |
| 10,453,723 B2 * | 10/2019 | Kasama | H01L 21/67393 |
| 11,551,957 B2 * | 1/2023 | Eggum | H01L 21/67376 |
| 2004/0237244 A1 | 12/2004 | Suzuki | |
| 2005/0077204 A1 | 4/2005 | Sumi | |
| 2005/0252827 A1 | 11/2005 | Tieben | |
| 2008/0121560 A1 | 5/2008 | Tieben | |
| 2008/0142102 A1 * | 6/2008 | Savard | F16K 15/148 137/854 |
| 2010/0163452 A1 | 7/2010 | Lin | |
| 2012/0138171 A1 | 6/2012 | Coolens | |
| 2015/0090357 A1 * | 4/2015 | Yang | F16K 15/148 137/843 |
| 2018/0252324 A1 * | 9/2018 | Yang | F16K 15/148 |

FOREIGN PATENT DOCUMENTS

| | | |
|---|---|---|
| CN | 103867760 | 6/2014 |
| JP | 08203993 A | 8/1996 |
| JP | 2002510150 A | 4/2002 |
| JP | 2004146676 A | 5/2004 |
| JP | 2004531064 | 10/2004 |
| JP | 2007533166 A | 11/2007 |
| JP | 2009277687 | 11/2009 |
| JP | 2010270823 A | 12/2010 |
| JP | 2013513951 A | 4/2013 |
| WO | 02093622 | 11/2002 |
| WO | 2005102872 A2 | 11/2005 |
| WO | 2008062537 A2 | 5/2008 |
| WO | 2011072260 A2 | 6/2011 |
| WO | 2014081825 A1 | 5/2014 |
| WO | 2015132910 A1 | 9/2015 |
| WO | 2016089912 A1 | 6/2016 |

* cited by examiner

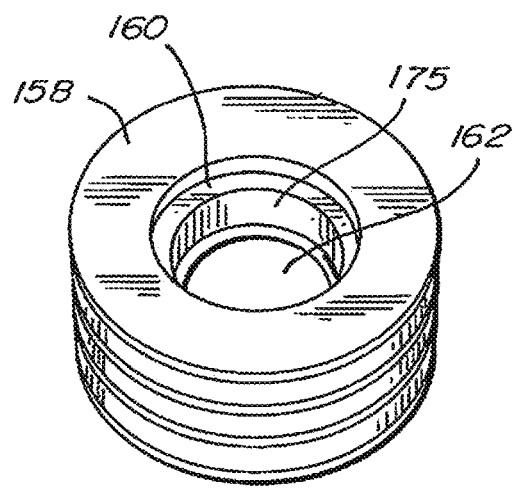
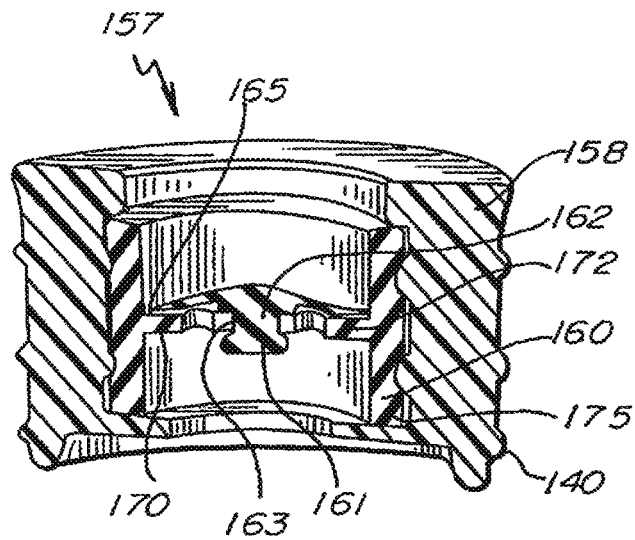
Fig.9  Fig.10
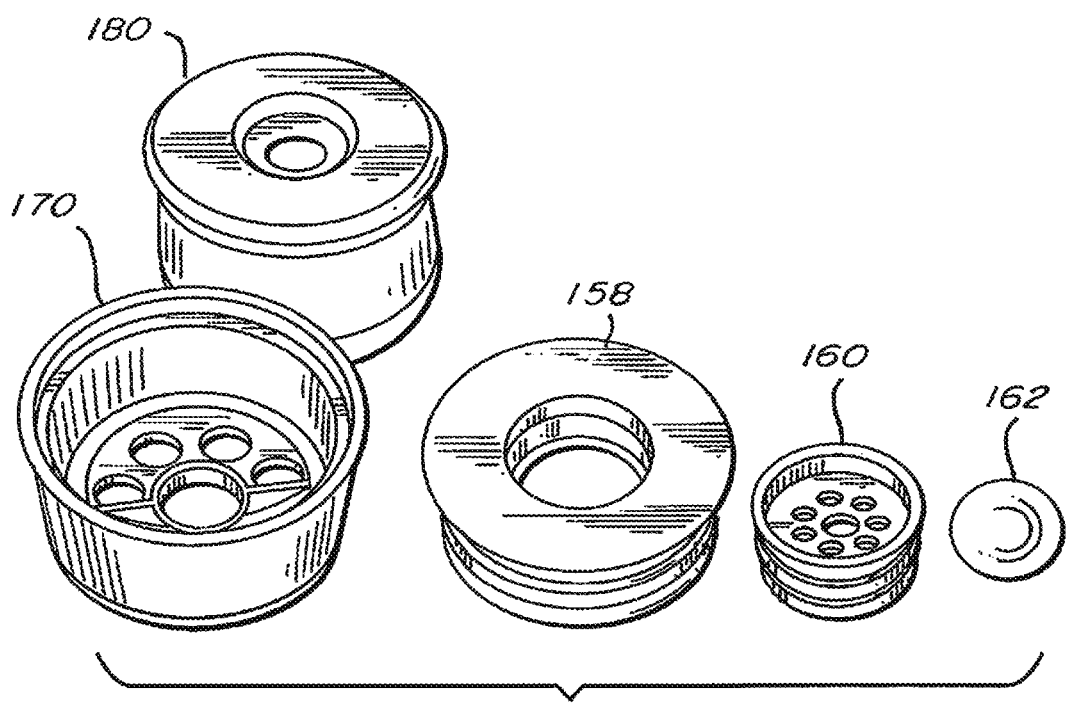
Fig.11

SUBSTRATE CONTAINER VALVE ASSEMBLIES

CROSS-REFERENCE TO RELATED APPLICATIONS

This application is a divisional application of U.S. patent application Ser. No. 15/532,230, filed Jun. 1, 2017, which is a national phase entry application of International Patent Application No. PCT/US2015/063260 filed Dec. 1, 2015, which claims priority to U.S. Provisional Application No. 62/086,022, filed Dec. 1, 2014.

BACKGROUND

In general, substrate containers or carriers are used for transporting and/or storing batches of silicon wafers or magnetic disks before, during and after processing of the wafers or disks. The wafers can be processed into integrated circuits and the disks can be processed into a magnetic storage disks for computers. The terms wafer, disk, and substrate are used interchangeably herein and any of these terms can refer to semiconductor wafers, magnetic disks, flat panel substrates, reticles, and other such substrates, unless otherwise indicated.

The processing of wafer disks into integrated circuit chips often involves multiple steps where the disks are processed at various processing stations, and stored and transported between processing steps. Due to the delicate nature of the disks and their susceptibility to contamination by particles or chemicals, it is vital that they are properly protected throughout this procedure. Wafer containers have been used to provide this necessary protection. Additionally, since the processing of disks is generally automated, it is necessary for disks to be precisely positioned relative to the processing equipment for the robotic removal and insertion of the wafers. Another purpose of a wafer container is to securely hold the wafer disks during transport. The terms wafer containers, carriers, cassettes, transport/storage bins, and the like, are used interchangeably herein unless otherwise indicated.

During processing of semiconductor wafers or magnetic disks, the presence of or generation of particulates presents very significant contamination problems. Contamination is accepted as the single largest cause of yield loss in the semi-conductor industry. As the size of integrated circuitry has continued to be reduced, the size of particles which can contaminate an integrated circuit has also become smaller, making minimization of contaminants all the more critical. Contaminants in the form of particles may be generated by abrasion such as the rubbing or scraping of the carrier with the wafers, with the carrier covers or enclosures, with storage racks, with other carriers or with processing equipment. Additionally, particulates such as dust can be introduced into the enclosures through the openings or joints in the covers and/or enclosures. Thus, a critical function of wafer carriers is to protect the wafers therein from such contaminants.

Containers are generally configured to axially arrange the wafers or disks in slots, and to support the wafers or disks by or near their peripheral edges. The wafers or disks are conventionally removable from the containers in a radial direction upwardly or laterally. The containers may have a shell portion with a lower opening, a door to latch into the lower opening, and a discrete carrier that rests on the door. This configuration, known as a SMIF pod, is illustrated in U.S. Pat. Nos. 4,995,430 and 4,815,912, both owned by the owner of the instant application and both incorporated herein by reference. Additionally, wafer carrier assemblies can have front openings with doors that latch onto front openings, which are known as FOUPs or FOSBs, and are described in, for example, U.S. Pat. Nos. 6,354,601, 5,788, 082 and 6,010,008, all of which are incorporated by reference herein. In certain configurations, the bottom covers or doors, front doors or the container portions have been provided with openings or passageways to facilitate the introduction and/or exhaustion of gases such as nitrogen or other purified gasses, into the wafer carrier assemblies to displace ambient air that might have contaminants.

Wafer containers and reticle containers known in the art have used various connection or coupling mechanisms for fluidly interfacing the flow passageways of the wafer containers to fluid supply and pressure or vacuum sources. Such attachment and sealing requires specialized components which may be of complex configuration. Certain current designs include a check valve having a frame, a plunger, O-rings and metal spring, one or more of which can lead to wafer contamination through the generation of particulates or other contaminants. Additionally, some purge-valve designs are susceptible to compressive forces during installation, potentially deforming a frame of the check valve and leading to leakage.

SUMMARY

According to one aspect of the disclosure, a substrate container includes a container portion having an open side or bottom, and a door to sealingly close the open side or bottom, one of the door and the container portion defining access structure. The substrate container additionally includes a check-valve assembly, the check-valve assembly being retained with respect to the access structure to provide fluid communication with an interior of the substrate container. The check-valve assembly includes a grommet, the grommet being formed of an elastomeric material. A valve seat is disposed within the grommet, the valve seat being integrally formed with the grommet according to one aspect, and being formed of a separate piece according to another aspect. An elastomeric disk shaped valve member retained by a central stem to the valve seat, for example an elastomeric umbrella valve member, according to one aspect, is disposed within the grommet and held to engage the valve seat, thereby restricting fluid flow through the check-valve assembly with respect to the interior of the substrate container.

The number of parts within a check-valve assembly is substantially reduced, in some cases including only two parts: an elastomeric grommet having internal structure defining one or more valve seats, and an associated elastomeric umbrella check valve member. The elastomeric valve member optionally is reversible within the grommet to restrict fluid flow through the check-valve assembly in an opposite direction. According to another aspect, a check-valve assembly includes only three parts: an elastomeric grommet, a substantially rigid housing within the grommet, and an elastomeric umbrella valve member.

A feature and advantage of embodiments of the invention is that an elastomeric disk shaped valve member cooperates with a flat elastomeric valve seat in a valve. The utilization of elastomeric valve component assembling and functioning with another elastomeric valve component provides ease of assembly and a high level of sealing integrity. With respect to an umbrella valve with a disk portion and a stem portion, the elastomeric stem portion in inserted into an opening defined by elastomeric material and the disk seats against the elastomeric valve seat. In embodiment the disk shaped member has a convex shape facing away from the valve seat in an unactuated state and the disk inverts, when actuated by gas passing through the valve, such that the shape is concave or flat facing away from the valve seat. In other embodiments, the disk may be flat in the unactuated state and change to a concave shape facing away from the valve seat when actuated with gas passing through the valve. In other embodiments the disk may be flat and be pivotally attached to the valve seat at a periphery of the disk and operate as a flap.

According to another aspect, a check-valve assembly is disposed in a stacked configuration, end-to-end with respect to a grommet. Various housings and retention mechanisms for check-valve assemblies also are disclosed. Other check-valve assemblies, check-valve modules, and associated methods are also disclosed.

BRIEF DESCRIPTION OF THE DRAWINGS

FIG. 9 is a top perspective view of a check-valve assembly according to an alternative embodiment of the disclosure;

FIG. 10 is a cutaway perspective view of the FIG. 9 assembly;

FIG. 11 shows component parts of the assembly shown in FIGS. 9-10, and a completed assembly module;

DETAILED DESCRIPTION

Figure 1:
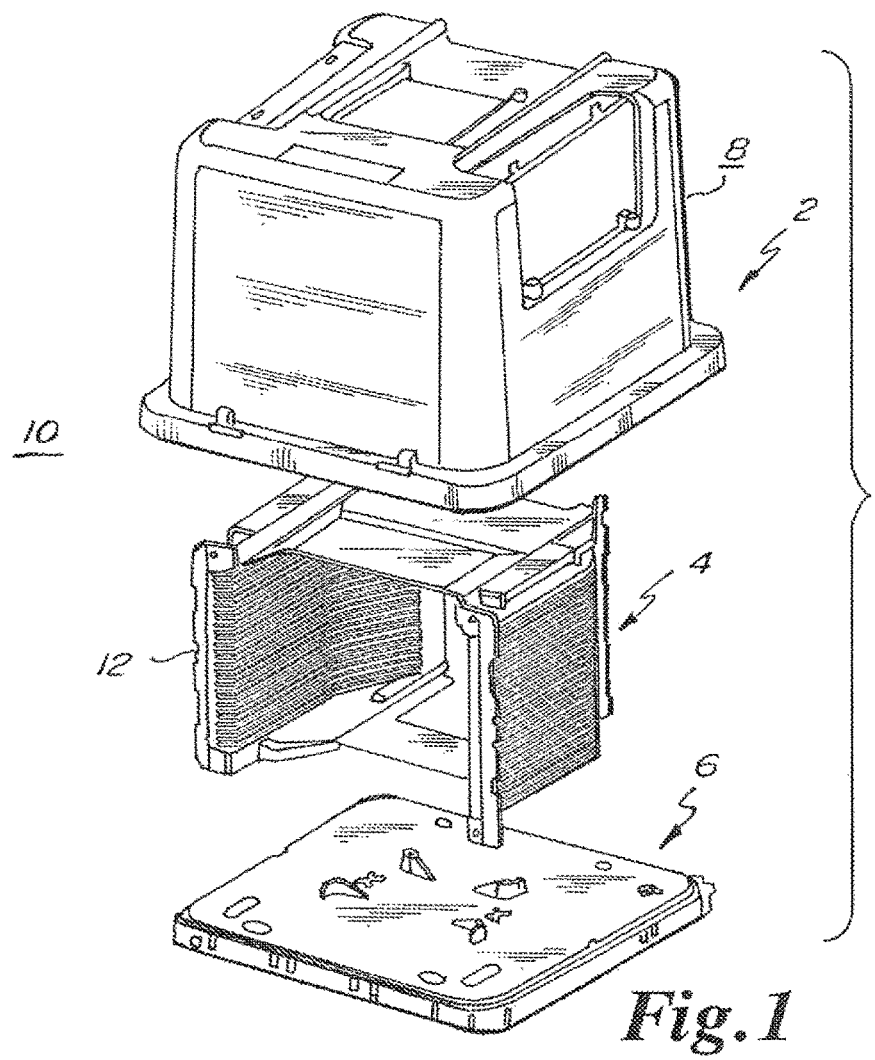
FIG. 1 is an exploded perspective view of a substrate container assembly, according to an embodiment of the disclosure.

FIG. 1 illustrates an example wafer container assembly 2 in which embodiments of the disclosure can be implemented. Container assembly 2 includes wafer carrier 4, bottom door 6, and enclosure portion 8. Bottom door 6 is adapted to sealably couple with enclosure portion 8 to define an interior space that can be isolated from ambient atmosphere 10. As shown in FIG. 1, wafer carrier 2 can comprise a plurality of elements 12, such as shelves, that can hold and position a plurality of silicon wafers or other substrates within wafer carrier 2. Generally, elements 12 hold and position the substrates such that contact between adjacent wafers is minimized, which can reduce damage to the substrates that can occur during processing and/or transportation.

Figure 2:
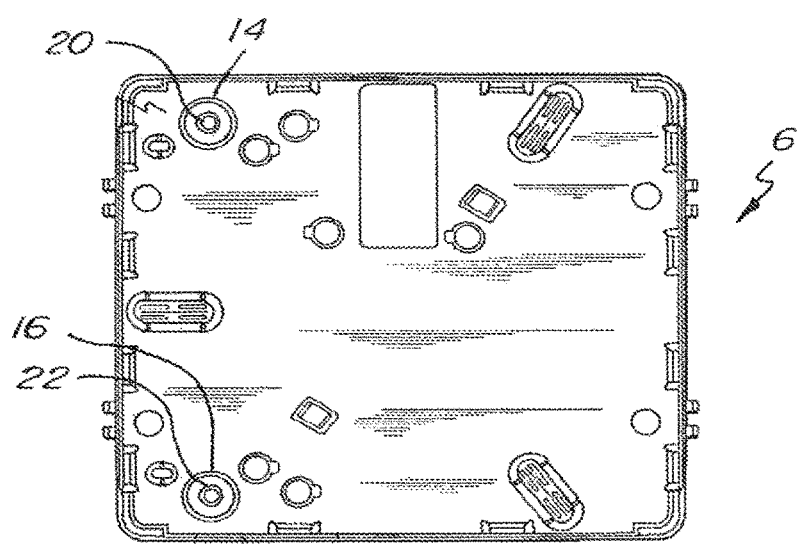
FIG. 2 is a bottom view of an example bottom cover of the FIG. 1 assembly.

FIG. 2 illustrates an example bottom door 6 in more detail. Section 6 comprises access structures in the form of openings 14, 16. According to one embodiment, opening 14 facilitates the introduction of gases or other fluid transfer into container assembly 2. Similarly, opening 16 facilitates the removal of gases or other fluid transfer out of container assembly 2, e.g. such that gas or fluid located within container assembly 2 can be vented to the ambient atmosphere. Thus, according to one embodiment, opening 14 is an inlet, while opening 16 is an outlet. Although FIG. 2 illustrates an embodiment where bottom door 6 comprises two openings 14, 16, embodiments having four, five, six, or more access structures located in bottom door 6 are contemplated and are within the scope of the present disclosure. It should also be understood that embodiments of the disclosure can be implemented in a section of container assembly 2, or similar container, that is a non-removable, non-openable section.

As illustrated in FIG. 2, openings 14, 16 accommodate, or are disposed in association with, valve assemblies or modules according to the embodiments of the disclosure, illustrated generally at 20, 22. Valve assembly 20 is positioned at or within opening 14 to seal opening 14, and valve assembly 22 is positioned at or within opening 16 to seal opening 16. Valve assemblies 20, 22 each create a seal against the interior of their corresponding opening 14, 16, and each provide at least one bore or passageway for passage of gas or other fluids. One of ordinary skill in the art will recognize that the size, cross-sectional shape, and other features of openings 14, 16 and valve assemblies 20, 22 can be guided by gas flow requirements, operating pressures, and other characteristics of a particular wafer container assembly or environment. Specific embodiments of valve assemblies 20, 22 and associated components will be described with respect to FIGS. 6-25.

Figure 3:
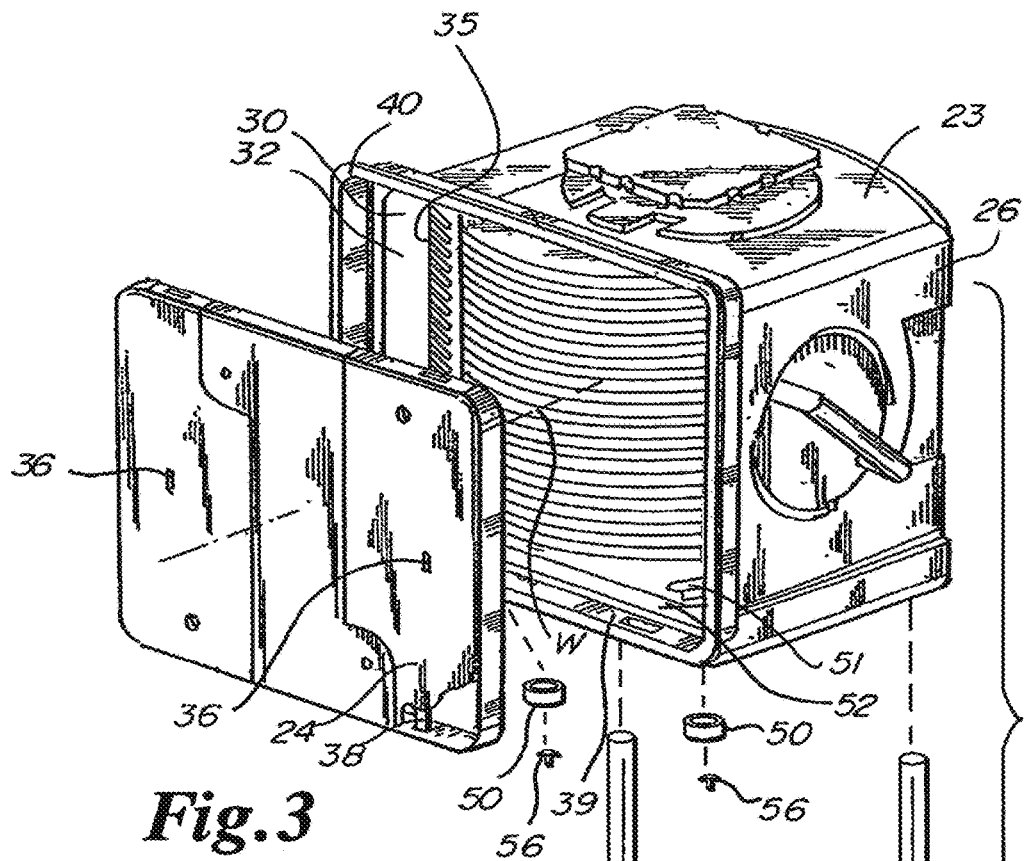
FIG. 3 is a perspective view of a front opening substrate container according to an embodiment of the disclosure.
Figure 4:
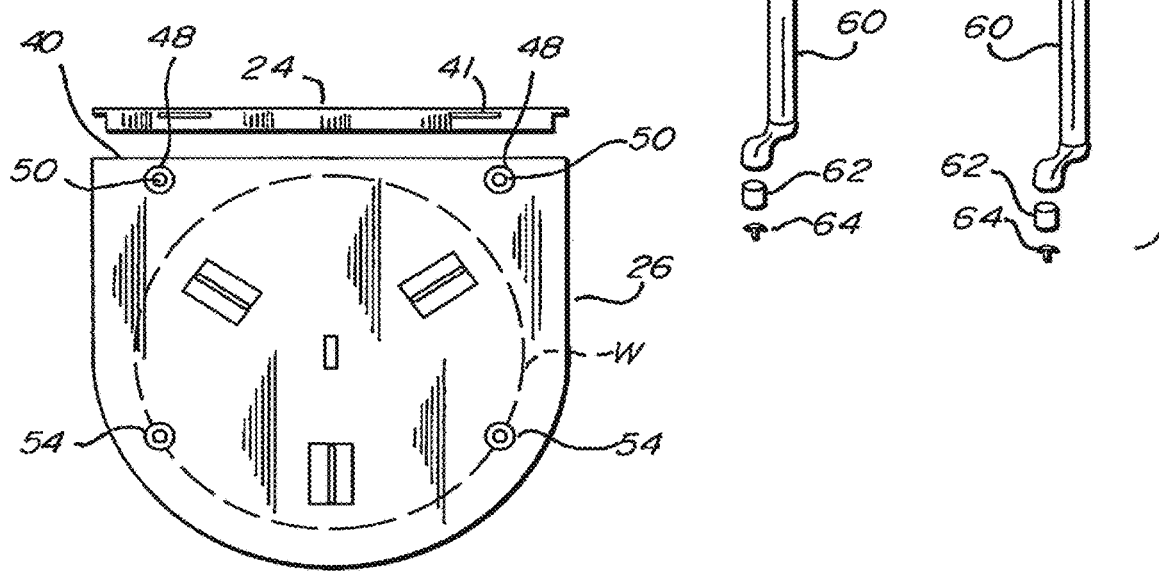
FIG. 4 is a bottom view of the substrate container of FIG. 3.

FIGS. 3-4 illustrate another configuration of a wafer container assembly 23, known as a FOUP (front opening unified pod) or FOSB (front opening shipping box), in which embodiments of the disclosure can be implemented. Container assembly 23 generally includes door 24 and container portion 26. Container portion 26 has front opening 30 leading into container interior 32 where a plurality of wafers W are retained on wafer shelves 35. Door 24 has key access holes 36 and latch mechanism 38 partially illustrated in the interior of the door enclosure. Latch tips 41 engage recesses 39 in the container portion door frame 40.

Container assembly 23 has purge capabilities with a pair of forward purge ports 48 and rearward purge ports 54. Ports 48, 54 have purge grommets 50 secured into access structure or grommet receiving structure 51, located on bottom 52 of container assembly 23 and optionally associated with each port 48, 54. Check valves 56 according to embodiments of the disclosure are inserted into the grommets to form valve assemblies that control the direction of purging gas fluid flow. Additionally, tubular environmental control components configured as purge towers 60 are illustrated, which optionally receive grommets 62 and check valves 64. Specific embodiments of valve assemblies, grommets, check valves, and associated components will be described with respect to FIGS. 6-25.

Figure 5:
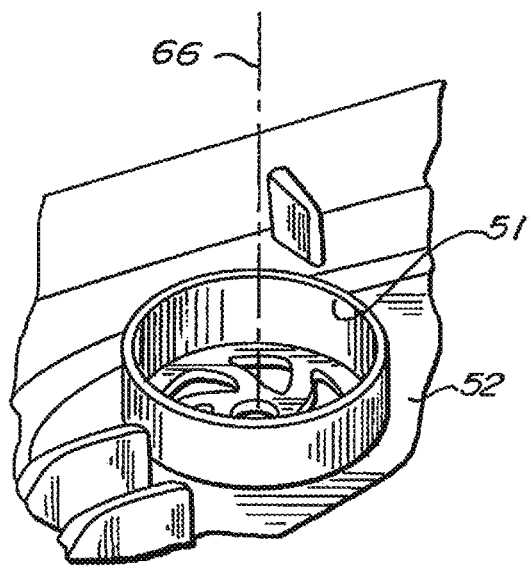
FIG. 5 is a perspective view of receiving structure according to an embodiment of the disclosure.

FIG. 5 illustrates one type of access structure or receiving structure 51 disposed in a wall or cover of a substrate container, for example bottom 52 or side cover of container assembly 23, according to an embodiment of the disclosure. Structure 51 constitutes inlet or outlet structure for fluid passage into or out of container assembly 23, and is constructed to receive and/or accommodate valve assemblies and modules along central axis 66. Access structures or retaining structures contemplated in this disclosure function as purging ports and optionally include retaining structures having geometry specially adapted to sealably engage grommets or valve assemblies and modules. The grommets and assemblies/modules themselves optionally include various sealing features for creating fluid-tight contact with certain interior features of associated access or retaining structures.

FIGS. 6-25 illustrate various valve assemblies and modules, according to aspects of the disclosure, that can be implemented in or with respect to doors, side walls, bottom walls, purge tubes, or other components of wafer carriers such as those illustrated in FIGS. 1-5, or other types of carriers and containers.

FIGS. 6-25 additionally illustrate various types of grommets or other structures used in sealing openings or ports in substrate containers, according to embodiments of the disclosure. Generally speaking, the grommets or structures include a body having a bore located within the body, the bore extending along the major axis of the body. Additionally, embodiments of grommets of the present disclosure comprise an operation element located with the bore. The operation element can comprise a check valve that can regulate the flow of gas or other fluids through the bore, a filter, a sensor or combinations thereof. The check valves employed in the present disclosure can be oriented within the bore such that the grommets can be used to seal both inlet and outlet openings on substrate container doors and/or enclosures. Additionally, the design of the grommet body optionally can facilitate sealing of the opening without the need for additional O-rings attached to the grommet. Furthermore, embodiments of grommets of the present disclosure can combine a grommet body, check valve and/or filter into an integral cartridge or module, which can improve the overall sealing ability of the grommets and can facilitate easier construction of substrate container assemblies. In some embodiments, the grommets have an axial height from about ⅛ inch to about 1 inch, while in other embodiments the grommets can have an axial height from about ⅜ inch to about ¾ inch. Additionally, embodiments of grommets of the present disclosure can have a diameter from about ¼ inch to about 1.5 inches, while in other embodiments the grommets can have a diameter from about ½ inch to about ¾ inch. One of ordinary skill in the art will recognize that additional ranges of axial height and diameter of the grommets are contemplated and are within the scope of the present disclosure.

The check valve members as illustrated have a disk and a valve seat connection portion configured as a central stem centrally attached to the disk. In other embodiments, the valve seat connection portion may be at a periphery of the disk such that the disk operates as a flap pivoting about the connection portion.

The grommets can be distinguished from O-rings known in the art in a number of ways. For example the grommet configuration provides an elastomeric element that is generally of a cylindrical configuration with a bore extending therethrough, the bore itself having a cylindrical configuration. The bore is of sufficient length to contain totally or substantially the entire length of an operational component inserted therein. The grommet preferably has at least one planar surface arranged to be normal to the axis of the grommet. Such surface can be utilized to effectively provide a seating surface for a nipple or nozzle as part of a purging system. Volumetrically, the grommet is preferably larger that the operational component, or any associated structure, contained within the grommet. The grommet preferably has a cross sectional area taken in an axial plane whereby the cross sectional area of the grommet is greater that the cross sectional area of the opening extending axially therethrough. The grommet preferably has an axial length that is greater than the diameter of the opening or bore extending axially through the grommet. Grommets described herein optionally have a non-circular cross-section in elevation, cylindrical inner facing surfaces, cylindrical outer facing surfaces, and planar end surfaces.

Figure 6:
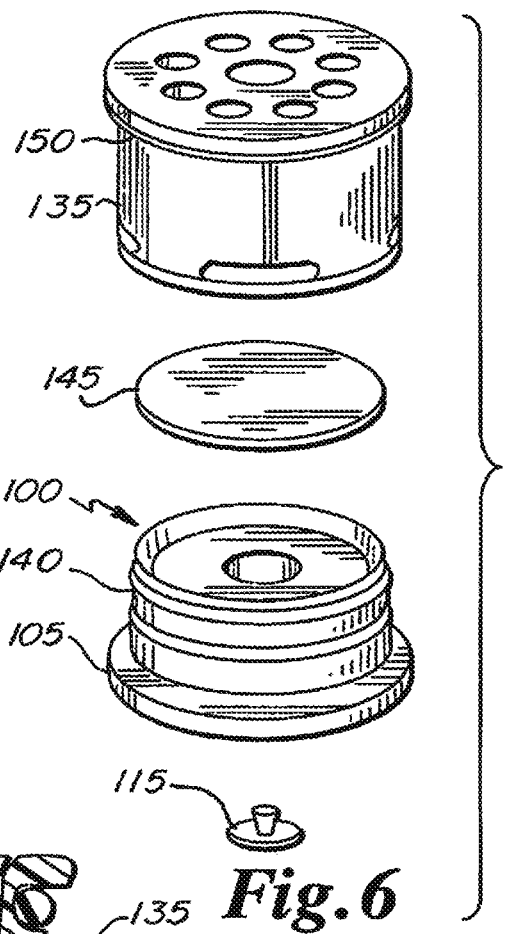
FIG. 6 is an exploded view of a check-valve module, according to an embodiment of the disclosure.
Figure 7:
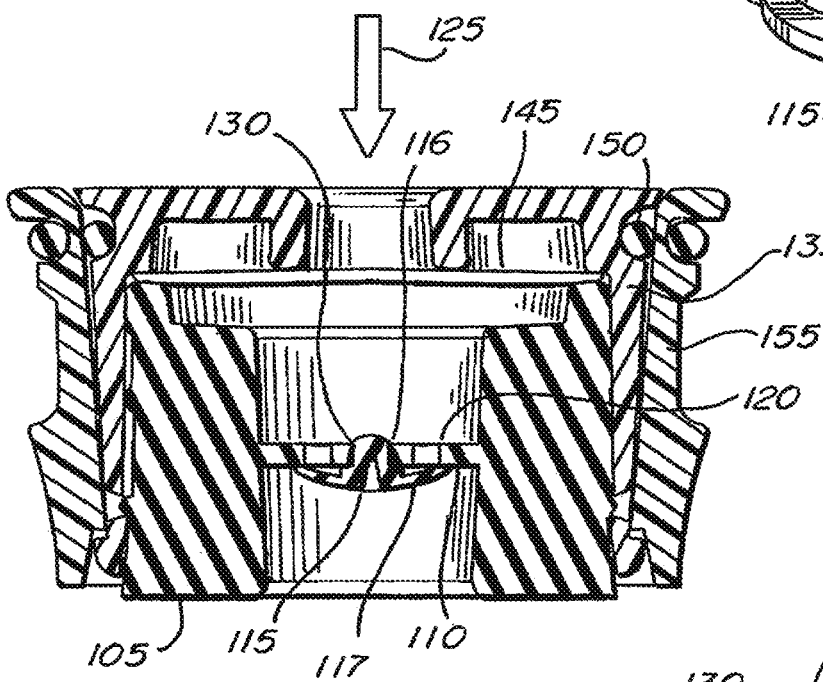
FIG. 7 is a cross-sectional view of an assembled module formed of the FIG. 6 components.
Figure 8:
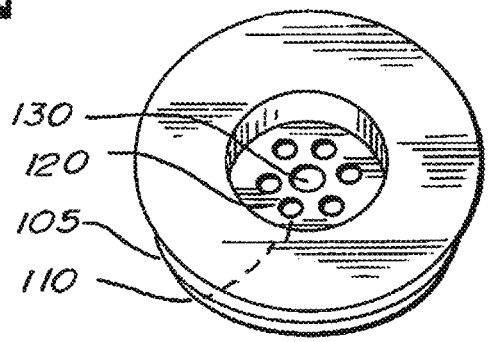
FIG. 8 is a top perspective view of a grommet shown in FIGS. 6-7.
Figure 12:
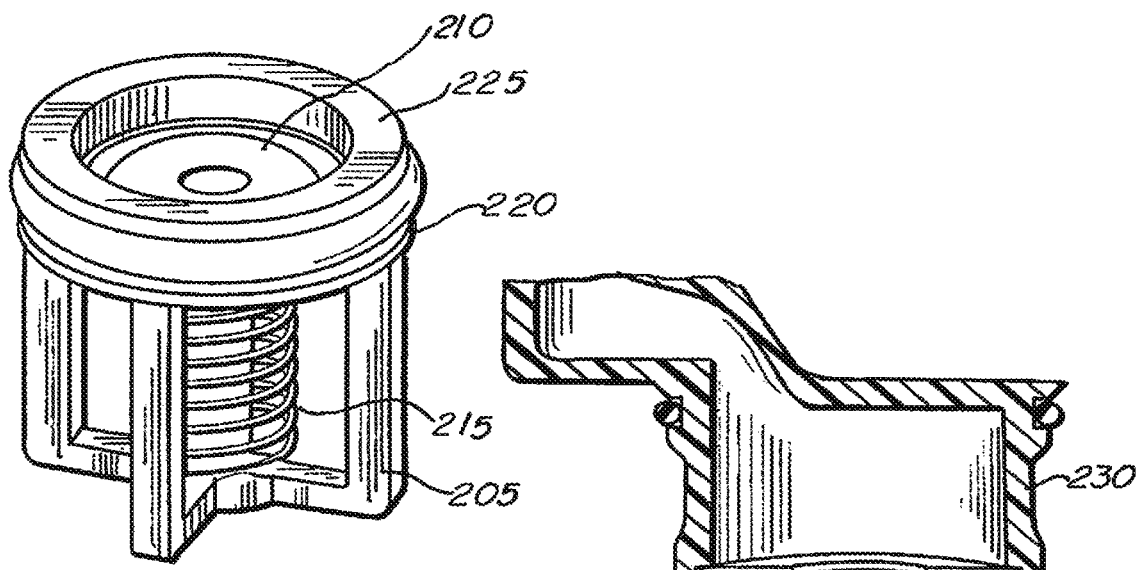
FIGS. 12-13 show check-valve module components and an installed check-valve module to be replaced, according to an embodiment of the disclosure.
Figure 13:
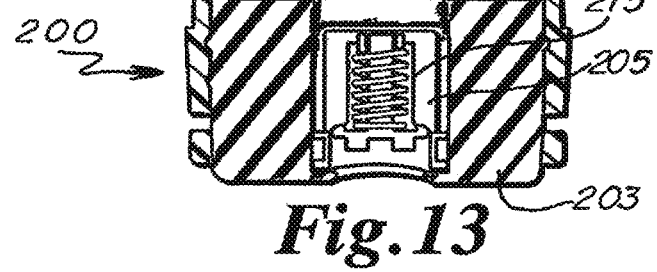

Turning to specific aspects of the disclosure, FIGS. 6-8 illustrate a first type of check-valve assembly 100. Check-valve assembly 100 includes grommet 105 having internal structure 108 defining valve seat 110. Internal structure 108 and valve seat 110 are disposed at substantially a midpoint of grommet 105 along its axial length, though other positions along the axial length are also contemplated. Grommet 105 optionally is a purge grommet, defining a purge grommet interface adapted to sealingly connect to a purge nozzle for introducing or withdrawing gases from the interior of a substrate container.

Umbrella check valve member 115 is disposed and held within elastomeric grommet 105 to engage/disengage valve seat 110 and thereby restrict or allow fluid flow through check-valve assembly 100. Apertures 118 through internal structure 108 of grommet 105 allow fluid flow along the axial length of grommet 105.

As illustrated in FIG. 7, for example, umbrella check valve member 115 is oriented such that purge gas or other fluid is allowed to flow out of the substrate container interior, as indicated by arrow 125, for egress through check-valve assembly 100. Umbrella check valve member 115 engages valve seat 110 to disallow fluid flow in an opposite, or ingress, direction. Umbrella check valve member has a stem portion 116 and a disk portion 117.

Internal structure 108 of grommet 105 additionally defines second valve seat 120, illustrated in FIG. 7, on an opposite side of structure 108 relative to first valve seat 110. Orienting umbrella check valve member 115 within grommet 105 to engage and disengage valve seat 120, instead of valve seat 110, permits fluid to flow in a direction opposite to that indicated by arrow 125, e.g. for ingress through check-valve assembly 100 and into the substrate container interior. Umbrella check valve member 115 then engages valve seat 120 to disallow fluid flow in an opposite, or egress, direction.

According to one embodiment, stem 116 of umbrella check valve member 115 is press-fit into central bore 130 of grommet 105, as viewed in FIG. 8, for example, for flow ingress. Alternatively, umbrella check valve member 115 is press-fit into central bore 130 from a bottom side of grommet 105, again as viewed in FIG. 8, for flow egress. Grommet 105 thus is constructed to retain valve member 115 in a first position, illustrated in FIG. 7, in which valve member 115 engages and disengages valve seat 110 to allow fluid flow only in one direction through assembly 100, as indicated by arrow 125 (egress). Grommet 105 also is constructed to retain valve member 115 in a second position, e.g. inserted from the top side of grommet 105 as viewed in FIG. 8, to allow fluid flow only in a second direction, opposite to arrow 125 (ingress). Grommet 105, internal structure 108, and valve seats 110, 120, together form a substantially "H"-shaped cross section, as shown in FIG. 7.

Grommet 105 is manufactured by injection molding a thermoplastic elastomer, according to one embodiment, or casting a rubber-like compound such as FKM. Accordingly, grommet internal structure 108 and valve seats 110, 120 are integrally formed as one-piece with grommet 105. Grommet 105 and seats 110, 120 are elastomeric and have associated elastomeric properties. Umbrella check valve member 115 is also formed by injection molding the same or similar materials, for example. According to one embodiment, a cracking pressure of umbrella check valve member 115 is between about 0.5 inches and about 5 inches H2O (between about 0.125 kPa and about 1.25 kPa). Other suitable manufacturing processes for grommet 105 and valve member 115 will be apparent to those of ordinary skill in the art upon reading this disclosure.

Forming one or more of umbrella valve member 115 and valve seats 110, 120 out of elastomeric materials provides a number of advantages, including easy assembly, non-critical relative size, excellent sealing performance, and reduction in the number of parts needed to achieve these advantages. Check-valve assembly 100, for example, is formed of just two pieces—elastomeric valve member 115 and elastomeric grommet 105 with its internal, integral, elastomeric valve seat(s). Valves and grommets are readily assembled for quick and effective installation, with minimal likelihood of error. One particular size or shape of grommet is not limited to receive one particular size or shape of valve, allowing interchangeability of parts and greater assembly flexibility. Additionally, elastomeric components are less likely to generate particulate contamination, as compared to e.g. metal springs or other components.

Returning to FIG. 6, grommet 105 and its associated valve are sealingly received within purge body housing 135. Grommet 105 optionally includes one or more circumferential protrusions or sealing rings 140 to seal against the interior surface of purge body housing 135. Additionally, filter 145 is disposed between grommet 105 and an interior of purge body housing 135. Embodiments of filter 145 and other filters disclosed throughout this patent application include particle filters of suitable technology, such as HEPA filtration or the like. Purge body housing 135 also optionally includes O-ring 150 to aid in forming a sealing connection with access structure or receiving structure 155 associated with a substrate container assembly. Purge body housing 135 is retained with respect to the substrate container assembly within structure 155 by retaining clips 156, for example, or by other suitable retaining structure. Together, purge body 135, grommet 105, valve member 11, and filter 145 form a check-valve assembly or module that is easily installable and replaceable in access structures associated with various types of substrate containers.

FIGS. 9-11 illustrate an additional embodiment of check-valve assembly 157, in which grommet 158 receives housing 160, formed of a substantially rigid plastic material, for example. Housing 160 retains umbrella check valve member 162 for engagement with valve seats 165 or 170, formed on opposite sides of housing internal structure 172, in a manner similar to that described with respect to FIGS. 6-8. Internal structure 172 and valve seats 165, 170 are disposed at a substantial midpoint of housing 160 along its axial length, and are disposed at a substantial midpoint of grommet 158 along its axial length, although placement closer to the ends of housing 160 and grommet 158 are also contemplated. Forming housing 160 and valve seats 165, 170 from a substantially rigid material, instead of molding them as an integral part of elastomeric grommet 158, provides additional structural resistance to external compressive forces that may act on grommet 158, for example. Stem 161 of valve member is retained in a central aperture 163 of the valve seat.

Check valve member 162 is optionally identical to check valve member 115 of the previously described embodiment, or constructed of different shape or size to fit a particular housing 160. As with the previous embodiment, different sizes or shapes of valve member 162 can be accommodated within housing 160, providing greater flexibility in manufacturing and inventory, among other advantages. Housing 160 defines circumferential protective sidewall 175 to surround umbrella check valve member 162. Housing 160 with protective sidewall 175 protects umbrella check valve member 162 from deformation or other damage that can be caused by external pressure acting upon grommet 158, for example upon insertion into access structure or other structure associated with a substrate container. Check-valve assembly 157 is formed of only three pieces: elastomeric valve member 162, housing 160, and grommet 158. Together, grommet 158 and housing 160 with structure 172 define a substantial "H"-shape in cross section, as shown in FIG. 10. Grommet 158 with housing 160 and the umbrella check valve member 162 are together inserted into housing 178 to form completed check valve module 180, all as shown in FIG. 11. Check valve module 180 is readily removably installed in associated retaining or access structure of a suitable substrate container.

One aspect of the disclosure includes retrofitting or replacing an existing check-valve assembly or module with one like that shown in FIGS. 6-8 or FIGS. 9-11. According to one example, shown in FIGS. 12-13, check-valve assembly 200 to be replaced includes purge grommet 203, frame 205 disposed within grommet 203, frame 205 supporting plunger 210, spring 215, and O-rings 220, 225, all installed within tubular environmental control structure 230 (FIG. 13) or other access or receiving structure. In the event installation forces, other forces, or normal wear have caused check-valve assembly 200 to be damaged or otherwise in need of replacement, aspects of the disclosure involve removing assembly 200 from structure 230 and replacing it with check-valve module 180 of FIGS. 9-11 or the check valve module of FIGS. 6-8, for example. Alternatively, it is possible to effect repair by removing frame 205 and its associated components from within purge grommet 203, and replacing them with housing 160 and associated umbrella check valve member 162. Purge designs such as those shown in FIGS. 12-13 potentially risk substrate contamination due to the presence of spring 215, in certain conditions, providing additional advantages to replacement in the manner described.

Figure 14:
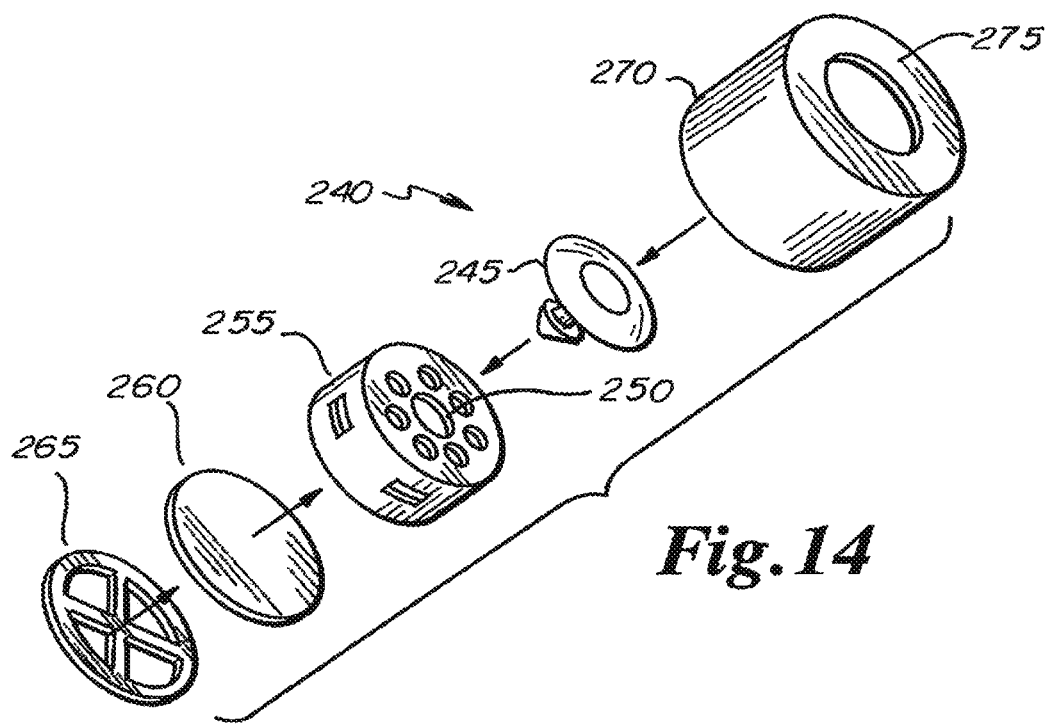
FIG. 14 is an exploded view of an additional check-valve module, according to an embodiment of the disclosure.

FIG. 14 shows an additional check-valve module 240 suitable for use with various substrate containers, according to an embodiment of the disclosure. Module 240 includes elastomeric umbrella valve member 245 inserted and retained within a central bore 250 of valve block 255. Filter 260 and filter cap 265 are disposed within or at the end of elastomeric or substantially rigid valve block 255. Valve block 255 snaps into or is otherwise retained within valve body 270. Interface surface 275 of valve body 270 sealingly connects to access or other structure associated with a substrate container. As with previous embodiments, umbrella valve member 245 can be inserted into bore 250 in an opposite orientation, i.e. from within valve body 255 as viewed in FIG. 14, to reverse the permissible direction of fluid flow.

Figure 15:
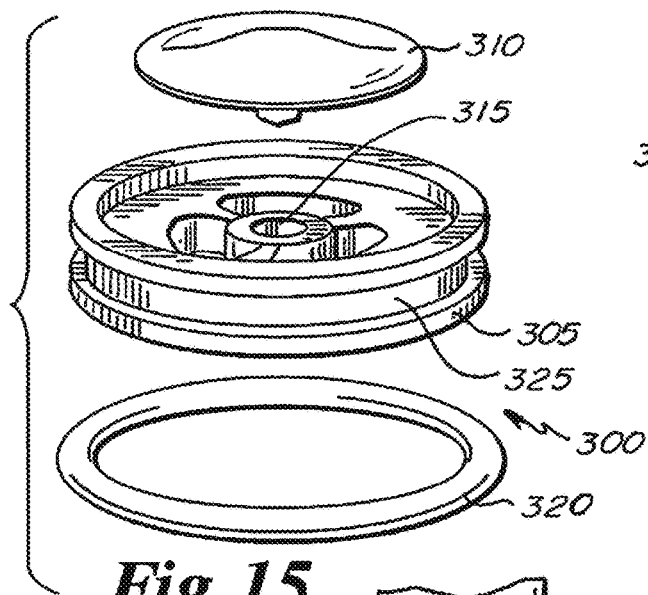
FIG. 15 is an exploded view of a check-valve module according to another embodiment of the disclosure.
Figure 16:
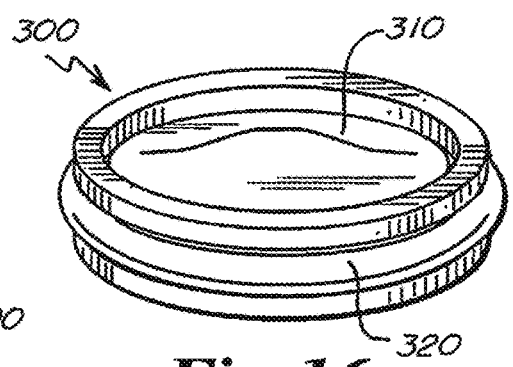
FIG. 16 is a perspective view of the FIG. 15 module in assembled form.
Figure 17:
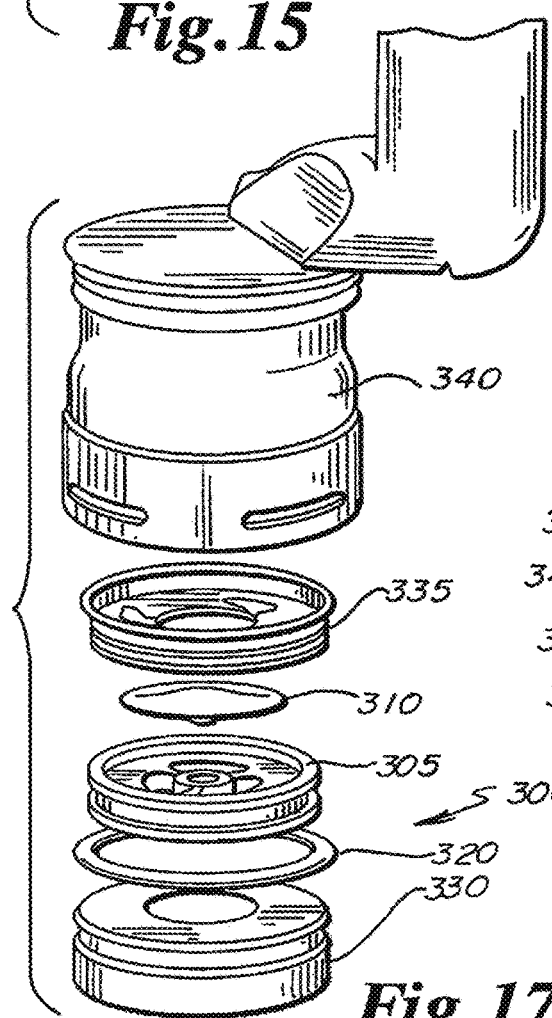
FIG. 17 is an exploded view of the FIG. 15 module with components for installation in surrounding structure.
Figure 18:
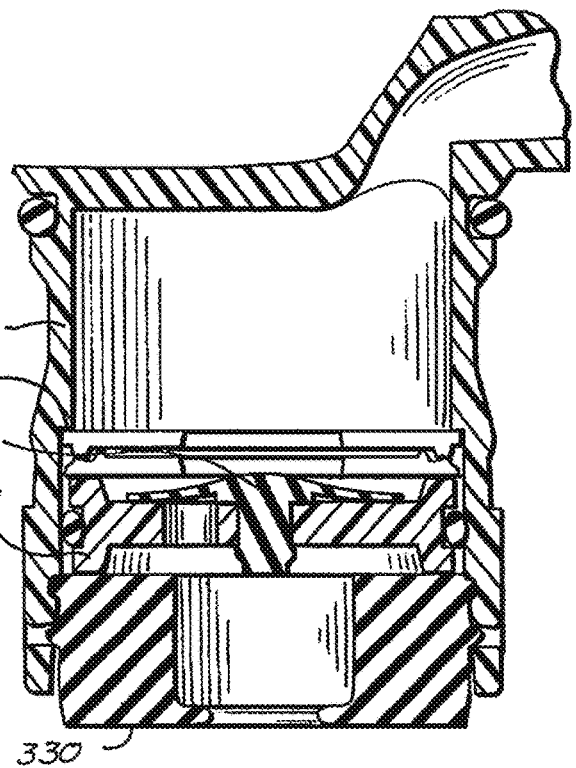
FIG. 18 is a cross-sectional view of the FIG. 17 module in assembled and installed form.
Figure 19:
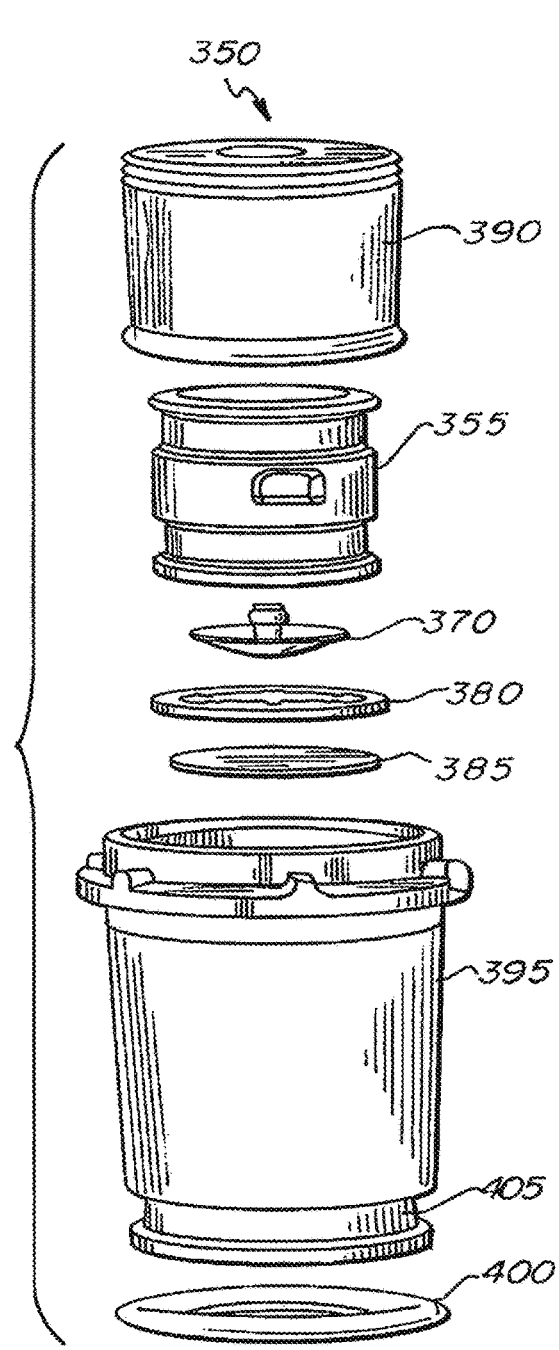
FIG. 19 is an exploded view of a check-valve module according to another embodiment of the disclosure.

As an additional embodiment, FIGS. 15-16 illustrate check-valve assembly 300 in unassembled and assembled states, respectively. Assembly 300 comprises substantially rigid valve seat 305 that retains elastomeric umbrella check valve member 310 within central bore 315. O-ring 320 is retained within circumferential groove 325 of valve seat 305 to seal valve seat 305 to surrounding structure. As shown in FIGS. 17-18, assembly 300 is combined with and stacked between purge grommet or other elastomeric interface 330, and filter component 335, in the form of a filter disc pack, for example, to form a module installed within tubular environmental control structure 340. Filter component 335 abuts against internal stop 342 of control structure 340 to prevent over-insertion, according to one embodiment. As with previously described embodiments, the orientation of valve member 310 with respect to valve seat 305, or the orientation of valve member 310 and valve seat 305 together with respect to surrounding structure, can be reversed, to reverse the direction of permissible flow through the module.

FIGS. 19-24 illustrate purge module 350, according to another embodiment of the disclosure. Module 350 includes valve housing 355, optionally formed of an elastomeric material and defining valve seats 360, 365. Elastomeric umbrella check valve member 370 is received within central bore 375 of housing 355. Filter grate 380 and filter 385 are in fluid communication with check valve member 370 and the remaining components. Housing 355 and its related components are received within injection molded diaphragm interface 390, which itself is received and retained within outer purge body 395 to form completed module 350. In use, optional O-ring 400 is received within groove 405 of purge body 395 and sealingly engages purge body 395 and module 300 with respect to surrounding structure.

Figure 20:
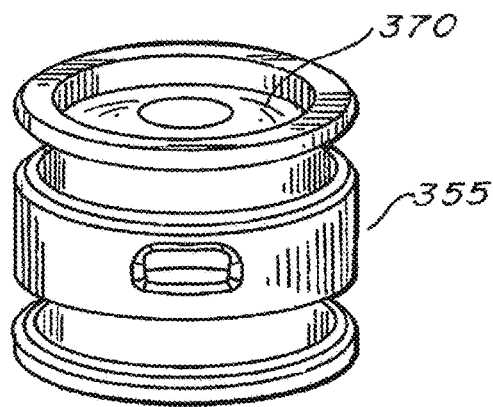
FIG. 20 is a perspective view of components of the FIG. 19 module, in assembled form.
Figure 21:
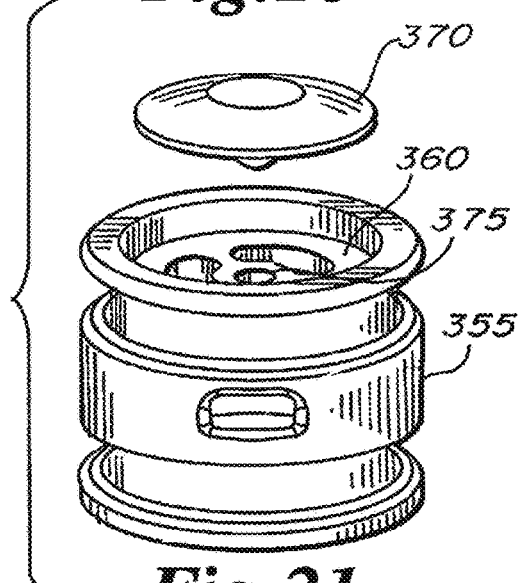
FIG. 21 is an exploded view of the FIG. 20 components.
Figure 22:
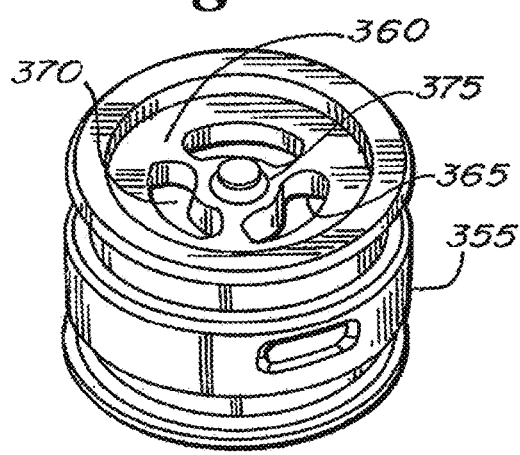
FIG. 22 is a perspective view of the FIG. 20 components assembled in an alternative configuration.
Figure 23:
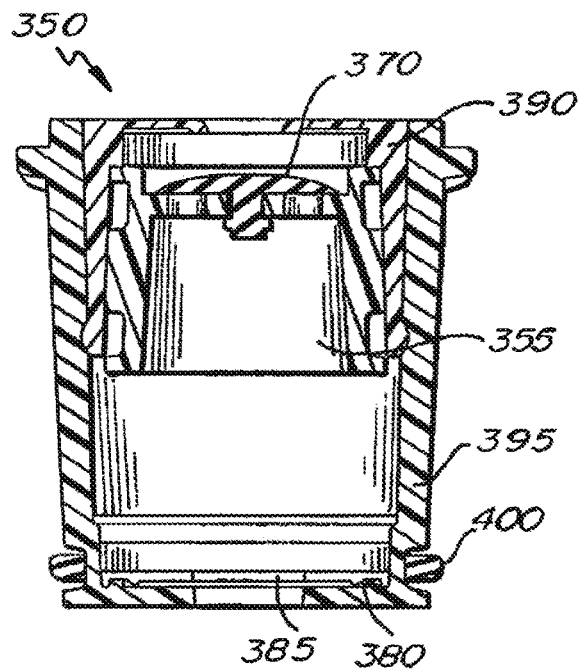
FIG. 23 is a cross-sectional view of the FIG. 19 module, installed in an outlet configuration.

FIGS. 20-21 show umbrella check valve member 370 press-fit into bore 375 against valve seat 360 in an outlet configuration, for example, permitting fluid flow with respect to an associated substrate container only in an outward or egress direction. FIG. 22 shows valve member 370 press-fit from an opposite end of housing 355 into central bore 375 in an inlet configuration, permitting fluid flow with respect to an associated substrate container only in an inward or ingress direction, for example. FIG. 23 shows assembled module 350 with umbrella check valve member 370 installed in an outlet configuration, and FIG. 24 shows assembled module 350 with umbrella check valve member 370 installed in an inlet configuration, according to embodiments of the disclosure.

Figure 24:
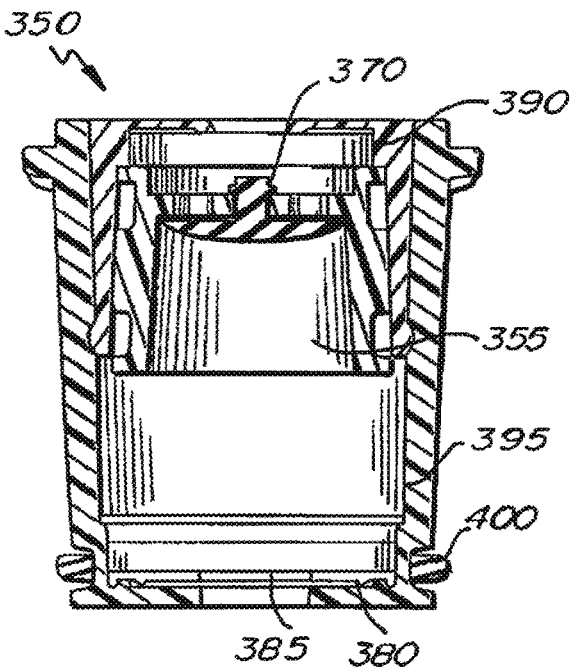
FIG. 24 is a cross-sectional view of the FIG. 19 module, installed in an inlet configuration.
Figure 25:
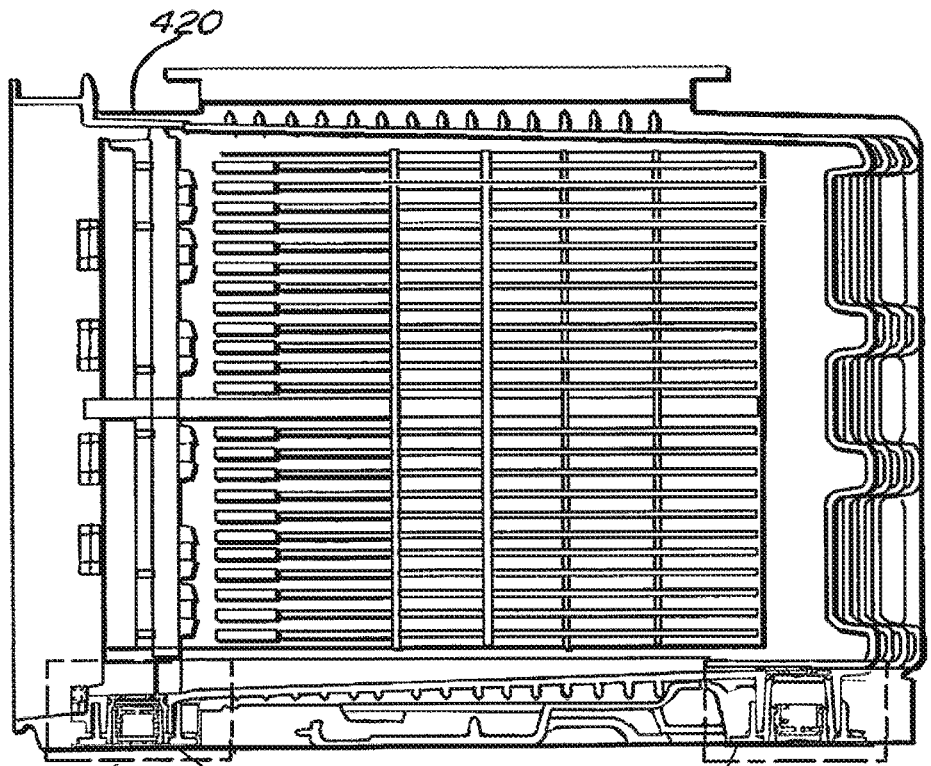
FIG. 25 is a schematic view of a substrate container assembly with the FIG. 24 module installed in inlet and outlet configurations.
Figure 25A:
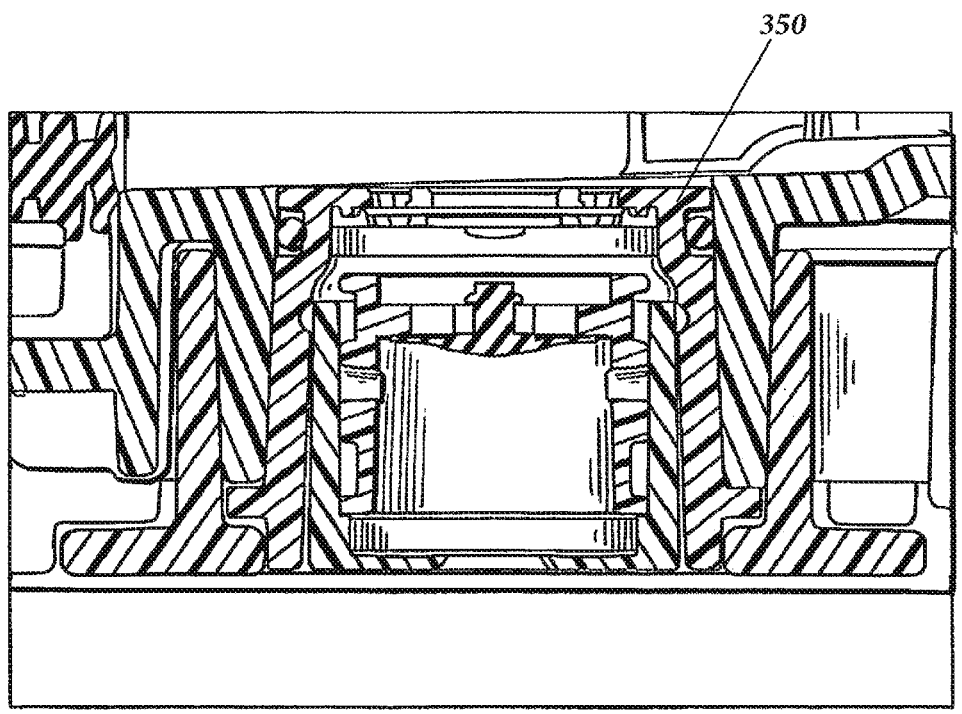
FIGS. 25A and 25B are close-up views of the FIG. 24 module installed in the substrate container of FIG. 25.
Figure 25B:
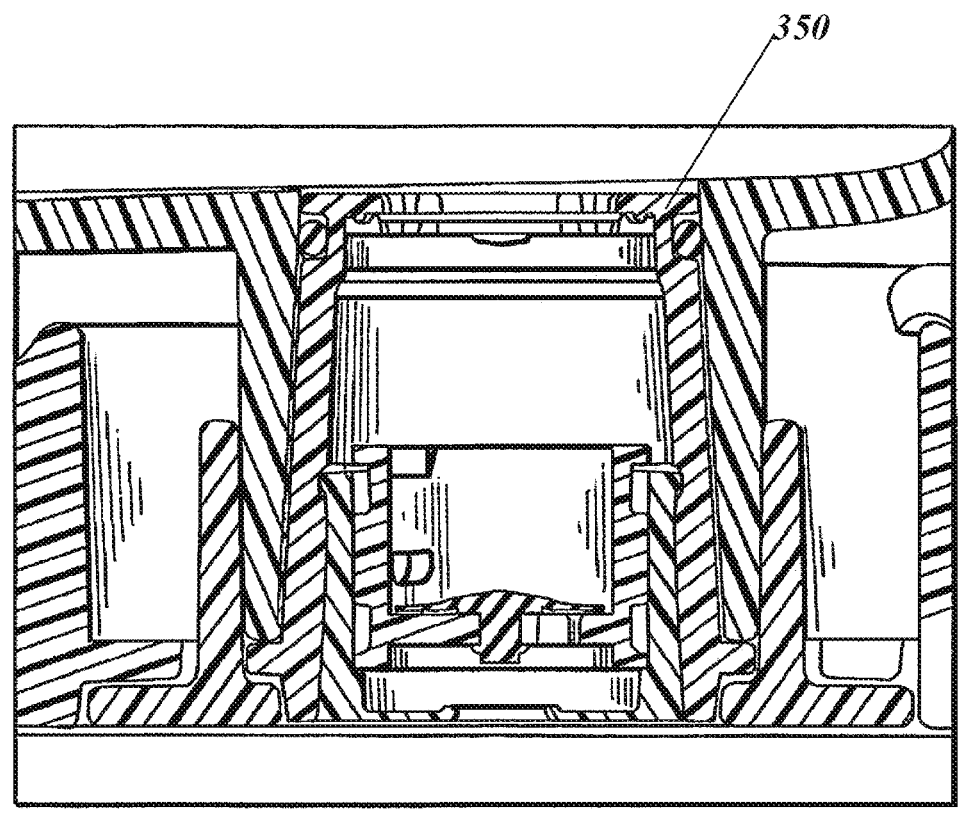

FIG. 25 shows module 350 of FIG. 24 installed in forward and reverse configurations with respect to substrate container assembly 420. In configuration 425, module 350 serves as a fluid outlet, permitting fluid to flow only away from the interior of substrate container assembly 420. In configuration 430, module 350 is inserted into receiving structure of container assembly 420 in a direction opposite to that of configuration 425, causing module 350 to serve as a fluid inlet and thus permit fluid flow only toward the interior of substrate container assembly 420. The two modules 350 of FIG. 25 can be identical or substantially identical in structure but reversed in relation to each other in installation, to permit fluid flow only in opposite directions relative to the substrate container.

In operation, inlet and outlet arrangements disclosed in FIG. 25 and elsewhere throughout this disclosure can function in concert during a purging activity in which existing air or gas within the interior of the substrate container is displaced by newly introduced air, gas, or other fluid. A vacuum source is optionally coupled to the interior volume of the container by an outlet nozzle that is adapted to interface with a contact surface of an associated valve assembly or module disclosed herein. When force is exerted by the outlet nozzle into an associated elastomeric grommet, the grommet compresses, but maintains its seal against the sealing inner surfaces of associated access or retaining structure of the container, and against the outer surface of valve assembly or module.

As vacuum is coupled with the interior volume of a substrate container, existing fluid in the volume is drawn out of the substrate container through an outlet as described herein, while, while replacement fluid is drawn in through an inlet, including through an associated filter. In a related embodiment, a replacement fluid source is coupled with the interior volume via an inlet nozzle having geometry similar to the outlet nozzle and coupled with an inlet grommet or assembly/module in the same manner in which the outlet nozzle is coupled with the outlet grommet or assembly/module. In another embodiment, no outlet nozzle is used. The inlet nozzle carries pressurized replacement fluid into the interior volume of the container, and displaced fluid simply exists through the outlet arrangement.

Check-valve assemblies and modules according to aspects of the disclosure provide a number of advantages over the prior art. The assemblies and modules are designed to be readily interchangeable, in certain cases, leading to easy repair and replacement of one module/assembly with another. Elastomeric components, as opposed to e.g. metal springs, reduce the risk of contaminants entering the interior of a substrate container. The number of parts within a check-valve assembly is substantially reduced, in some cases to just two pieces: a grommet having internal structure defining one or more valve seats, and an associated umbrella check valve member. Embodiments disclosed herein reduce the possibility of damage to components during installation, reducing the possibility leaking check valves. Embodiments of the disclosure can be used with containers accommodating multiple different substrates and sizes, for example 300 mm and 450 mm silicon wafers. Additionally, check valves according to embodiments of the disclosure are used to control ingress and egress of various gases or other fluids, for example clean dry air, nitrogen, or other suitable purge gas into and out of various microenvironments. Aspects of the disclosure also provide advantages over e.g. duckbill-type check valves disclosed in commonly assigned U.S. Pat. No. 7,201,276, which is incorporated herein by reference. As one example, umbrella valve members disclosed herein are normally or naturally closed, in a flow-obstructing position, whereas a duckbill-type valve needs to be pre-loaded with pressure in a closed position.

Generally, the various grommets, assemblies, and modules disclosed herein can have the same cross-sectional shape as the receiving structure in which they are disposed, or as the openings that they are designed to seal. For example, in one embodiment, grommets have a generally cylindrical shape with a generally circular cross-section. However, one of ordinary skill in the art will recognize a variety of grommet body geometries, for example tapered geometries, are within the spirit of the present disclosure. In one embodiment, inlet and outlet grommets or inlet and outlet modules disclosed herein are identical parts. Thus, various components of the present disclosure can be used to seal both inlet and outlet openings using the same component elements. In related embodiments, the umbrella check valve members disclosed throughout this application are identical parts. Grommets and modules of the present disclosure further include retaining features for securely holding filters and related components. Thus, the various modules and components described herein can be formed as pre-assembled operational subassemblies. Additional features of grommets, valve members and associates components are disclosed in U.S. Pat. Nos. 8,727,125 and 8,783,463, which are incorporated herein by reference. Additional carriers in which embodiments of the disclosure can be implemented are described in U.S. Pat. No. 6,428,729, which is hereby incorporated by reference.

The grommets, valve members, and other components of the present disclosure can be composed of any material suitable for use in semi-conductor processing applications including polymers and elastomers. In some embodiments, the grommet body and flanges can be composed of a fluoroelastomer. Examples of fluoroelastomers are sold under the trade name Viton® by Dupont Dow Elastomers. Additionally, in some embodiments, the elastomeric grommet body or grommet can have a fluoropolymer, or other inert polymer, coated onto to the surface of the grommet to isolate the elastomeric substance from the interior of the substrate container. Generally, the polymer or fluoropolymer coating should have some flexibility such that the sealing characteristics of the elastomeric grommet body are maintained.

The embodiments described above are intended to be illustrative and not limiting. Additional embodiments are within the claims. Although the present invention has been described with reference to particular embodiments, those skilled in the art will recognize that changes may be made in form and substance without departing from the spirit and scope of the invention.

What is claimed is:

1. A substrate container, comprising:
   a container portion having a container wall defining a container interior, the container portion further having a plurality of substantially horizontal spaced apart substrate shelves disposed within the interior;
   at least one substantially tubular environmental control component for directing fluid flow into the container interior;
   a check-valve assembly disposed within the control component, adapted to allow fluid flow into the substrate container through the control component, the check-valve assembly comprising:
      a substantially cylindrical valve seat portion; and
      an elastomeric umbrella check valve member held within the valve seat portion to substantially disallow fluid flow out of the container through the control component; and
      an elastomeric interface stacked with the check-valve assembly, an end of the elastomeric interface being sealingly engaged with an end of the check-valve assembly, and an outer circumference of the elastomeric interface being sealingly connected to the control component.

2. The substrate container of claim 1, further comprising:
   a filter component stacked with the check-valve assembly, the filter component being sealingly engaged with and disposed at another end of the check-valve assembly opposite to the elastomeric interface.

3. The substrate container of claim 2, wherein the filter component abuts against a stop disposed within the control component, to prevent over-insertion within the control component.

4. The substrate container of claim 1, wherein the valve seat portion is in the shape of a cylindrical disk and defines a circumferential groove; further wherein the substrate container comprises an 0-ring disposed within the groove to sealingly connect the check-valve assembly to the control component.

5. The substrate container of claim 1, wherein the valve seat portion is formed of a substantially rigid material.

* * * * *